US007875796B2

(12) United States Patent
Clemens et al.

(10) Patent No.: US 7,875,796 B2
(45) Date of Patent: Jan. 25, 2011

(54) REFLECTOR ASSEMBLIES, SYSTEMS, AND METHODS FOR COLLECTING SOLAR RADIATION FOR PHOTOVOLTAIC ELECTRICITY GENERATION

(75) Inventors: J. Christopher Clemens, Chapel Hill, NC (US); Charles R. Evans, Chapel Hill, NC (US); Daniel C. Gregory, Chapel Hill, NC (US); Russell M. Taylor, Pittsboro, NC (US)

(73) Assignee: MegaWatt Solar, Inc., Hillsborough, NC (US)

( * ) Notice: Subject to any disclaimer, the term of this patent is extended or adjusted under 35 U.S.C. 154(b) by 514 days.

(21) Appl. No.: 11/881,957

(22) Filed: Jul. 30, 2007

(65) Prior Publication Data

US 2008/0023061 A1 Jan. 31, 2008

Related U.S. Application Data

(60) Provisional application No. 60/834,143, filed on Jul. 28, 2006.

(51) Int. Cl.
*H01L 31/00* (2006.01)
*H01L 31/052* (2006.01)

(52) U.S. Cl. ..................... 136/259; 136/246
(58) Field of Classification Search ........... 136/246, 136/259
See application file for complete search history.

(56) References Cited

U.S. PATENT DOCUMENTS 257,560 A 5/1882 Deitzler
1,951,404 A 3/1934 Goddard
2,780,765 A 3/1954 Chapin et al.

(Continued)

FOREIGN PATENT DOCUMENTS

JP 2002-094104 3/2002

(Continued)

OTHER PUBLICATIONS

Notification of Transmittal of the International Search Report and the Written Opinion of the International Searching Authority, or the Declaration for International Application No. PCT/US2008/079097 (May 27, 2009).

(Continued)

*Primary Examiner*—Jessica L Ward
*Assistant Examiner*—Jacky Yuen
(74) *Attorney, Agent, or Firm*—Jenkins, Wilson, Taylor & Hunt, P.A.

(57) ABSTRACT

Disclosed is a lightweight reflecting system for the concentration of solar radiation in which the reflecting optic is approximately sinusoidal in cross section and is maintained in this shape by minimal contact with a support frame. The reflector can be a flexible rectangular sheet deformed into a generally sinusoidal trough by compression between fixed or adjustable end supports. The sinusoid can be adjusted to be less than half a cycle by torsion applied to each end of the flexible sheet. A reflective film, polished metal, or similar material on the reflector surface can concentrate sunlight along a diffuse band rather than a sharp line, providing improved concentration levels for photovoltaic cells. The reflectors and their support frames can be mounted singly or severally on a tracking device that maximizes instantaneous power output by orienting the collectors toward the sun.

13 Claims, 10 Drawing Sheets

U.S. PATENT DOCUMENTS

| | | | |
|---|---|---|---|
| 2,914,657 A | 11/1959 | Akely et al. | |
| 2,919,298 A | 12/1959 | Regnier et al. | |
| 3,232,795 A | 2/1966 | Gillette et al. | |
| 3,868,823 A | 3/1975 | Russell, Jr. et al. | |
| 3,923,381 A | 12/1975 | Winston | |
| 3,972,600 A | 8/1976 | Cobarg | |
| 3,994,279 A | 11/1976 | Barak | |
| 4,071,017 A | 1/1978 | Russell, Jr. et al. | |
| 4,093,351 A | 6/1978 | Perkins et al. | |
| 4,103,672 A | 8/1978 | Meyer | |
| 4,106,484 A | 8/1978 | Dame | |
| 4,110,010 A | 8/1978 | Hilton | |
| 4,115,149 A * | 9/1978 | Bell | 136/259 |
| 4,119,365 A | 10/1978 | Powell | |
| 4,120,282 A | 10/1978 | Espy | |
| 4,149,521 A | 4/1979 | Miller et al. | |
| 4,158,356 A | 6/1979 | Wininger | |
| 4,173,397 A | 11/1979 | Simpson | |
| 4,205,659 A | 6/1980 | Beam | |
| 4,237,864 A | 12/1980 | Kravitz | |
| 4,243,301 A | 1/1981 | Powell | |
| 4,278,829 A * | 7/1981 | Powell | 136/248 |
| 4,318,394 A | 3/1982 | Alexander | |
| 4,339,627 A | 7/1982 | Arnould | |
| 4,376,580 A | 3/1983 | Novak et al. | |
| 4,388,481 A | 6/1983 | Uroshevich | |
| 4,484,568 A | 11/1984 | Witt | |
| 4,571,812 A | 2/1986 | Gee | |
| 4,719,903 A | 1/1988 | Powell | |
| 4,734,557 A | 3/1988 | Alfille et al. | |
| 4,820,033 A | 4/1989 | Sick | |
| 4,888,063 A | 12/1989 | Powell | |
| 5,210,653 A | 5/1993 | Schell | |
| 5,269,728 A | 12/1993 | Rogers et al. | |
| 5,269,851 A | 12/1993 | Horne | |
| 5,325,844 A | 7/1994 | Rogers et al. | |
| 5,489,563 A | 2/1996 | Brand et al. | |
| 5,660,644 A | 8/1997 | Clemens | |
| 5,673,153 A | 9/1997 | Soll et al. | |
| 5,851,309 A | 12/1998 | Kousa | |
| 5,880,896 A | 3/1999 | Ishii et al. | |
| 6,035,850 A | 3/2000 | Deidewig et al. | |
| 6,464,363 B1 | 10/2002 | Nishioka et al. | |
| 6,818,818 B2 | 11/2004 | Bareis | |
| 6,886,339 B2 | 5/2005 | Carroll et al. | |
| 7,025,468 B2 | 4/2006 | Nishioka et al. | |
| 7,202,457 B2 | 4/2007 | Janus et al. | |
| 2004/0231715 A1 | 11/2004 | Pagel | |
| 2005/0257827 A1 | 11/2005 | Gaudiana et al. | |
| 2006/0096586 A1 | 5/2006 | Hayden | |
| 2006/0274439 A1 | 12/2006 | Gordon et al. | |
| 2008/0314440 A1 | 12/2008 | Clemens et al. | |
| 2009/0126774 A1 | 5/2009 | Taylor, II et al. | |

FOREIGN PATENT DOCUMENTS

| | | |
|---|---|---|
| JP | 2003-240356 | 8/2003 |
| JP | 2005313586 | 11/2005 |
| JP | 2005344006 | 12/2005 |
| WO | WO 2005/066533 | 7/2005 |
| WO | WO 2007/052156 | 5/2007 |

OTHER PUBLICATIONS

Notification of Transmittal of the International Search Report and the Written Opinion of the International Searching Authority, or the Declaration for International Application No. PCT/US07/16972 (Feb. 26, 2008).

Notification of Transmittal of the International Search Report and the Written Opinion of the International Search Authority, or the Declaration for Internation Application No. PCT/US07/17912 (Feb. 27, 2008).

* cited by examiner

FRACTIONAL SINE

REFLECTOR ASSEMBLIES, SYSTEMS, AND METHODS FOR COLLECTING SOLAR RADIATION FOR PHOTOVOLTAIC ELECTRICITY GENERATION

RELATED APPLICATIONS

This application claims the benefit of U.S. Provisional Patent Application Ser. No. 60/834,143, filed Jul. 28, 2006; the disclosure of which is incorporated herein by reference in its entirety.

TECHNICAL FIELD

The subject matter described herein relates generally to the field of solar energy collection and conversion. More particularly, the subject matter described herein relates to reflector assemblies, systems, and methods for collecting solar radiation for photovoltaic electricity generation.

BACKGROUND

Photovoltaic cells convert solar energy into electrical energy. Prior to the invention of the photovoltaic cell, however, solar energy was still used as a heat source to heat various materials. For example, solar energy can be used to heat the working fluid in a water heater or heat engine. Because the goal of solar heating systems is the transfer of thermal energy to a medium, reflectors were designed to concentrate the radiation from the heat source, typically the sun, onto the material being heated. Many of these reflectors were trough-shaped to achieve a sharp linear focus capable of delivering high concentrations of thermal energy.

After the invention of the photovoltaic cell, the same trough-shaped reflectors previously used to concentrate solar energy for heating were employed with the intent of concentrating light onto a photovoltaic cell to increase the performance of the cell. Early adopters of trough collector technology failed to recognize, however, that solar cells that convert visible and near infrared radiation (i.e., having a wavelength less than 1 micron) into electricity perform optimally under irradiation conditions very different from those required for the optimum collection of thermal energy. Specifically, the heat load introduced by focusing an image of the sun on silicon solar cells reduces their efficiency. In addition, most solar cells mass-produced today are larger than the solar image formed by focusing reflectors of practical focal length. As a result, the ability of the photovoltaic cells to convert light to electricity was underutilized because the entire surface of the cells was not exposed to solar energy, and the portions that were exposed received such concentrated heat loads so as to affect the cells' efficiency.

A few attempts have been made at designing a reflector system that utilizes more of the surface area of current solar cells and reduces the efficiency-draining effect of high heat loads. For example, it has been observed that displacing the receiver a fixed distance from the sharp focus of a parabolic reflector distributes the solar radiation, as well as the resulting heat load, over the surface of the cell.

Despite such developments, the positioning of a photovoltaic cell with respect to a solar radiation reflector is only one factor that affects the performance and desirability of a solar energy collection system. Many other considerations must be addressed to produce a cost-effective system for the collection and conversion of solar energy that can be readily mass-produced. For example, one such consideration is the total weight of the system. Practitioners of the art recognize that for a concentrating solar collection system to be effective, the system should be mounted on a device that tracks the sun to maintain a high concentration of solar energy on the photovoltaic receiver. The lighter the concentrating solar collection system, the less support is required to carry the system and the less power is required to orient the system with respect to the sun. Accordingly, it is advantageous to minimize the moving weight of these systems to save on material costs for the support structure and limit power losses associated with energizing the tracking system.

Other factors that should be considered in designing a solar energy collection system include ease of manufacturing, cost of manufacture, and durability. For instance, a collection system that requires injection molding or precise machining in order to construct a reflector system that increases photovoltaic efficiency may not be cost effective to mass produce. In addition, reflector systems that require glass or other fragile materials may be unsuitable for outdoor use due to potential wind or other damage.

In light of the factors that should be considered when creating a concentrating solar collection system, there exists a need for reflector assemblies, systems, and methods for collecting solar radiation for photovoltaic electricity generation.

SUMMARY

The subject matter described herein includes reflector assemblies, systems, and methods for collecting solar radiation for photovoltaic electricity generation.

According to one aspect, the subject matter disclosed herein includes a solar energy reflector assembly including a flexible plate being reflective on one surface. Supports coupled to opposing ends of the flexible plate are secured to a frame at a span less than the distance between the opposing ends when the flexible plate is unflexed. In this way, the flexible plate is flexed by compression along a dimension perpendicular to the ends coupled to the supports. Further, torquing members are coupled to the ends of the flexible plate that are coupled to the supports. The torquing members apply a torque to the ends of the flexible plate so that a cross section of the flexible plate forms a substantially sinusoidal curve for producing a blurred reflection of an electromagnetic radiation source at a predetermined distance from the reflective surface. A photovoltaic array support supports a photovoltaic array at the predetermined distance from the reflective surface so that the blurred image of the electromagnetic radiation source covers a substantial portion of a receiving surface of the photovoltaic array.

According to another aspect, the subject matter disclosed herein includes a concentrating solar energy collecting system for photovoltaic electricity generation having a frame, supports mounted at opposing ends of the frame, and a flexible plate being reflective on one surface secured at its ends to the supports. The distance between the ends of the flexible plate when unflexed is longer than the span between the supports such that the flexible plate is flexed by compression along a dimension perpendicular to the ends coupled to the supports. Torquing members are coupled to the ends of the flexible plate that are coupled to the supports. The torquing members apply a torque to the ends so that a cross section of the flexible plate forms a substantially sinusoidal curve for producing a blurred reflection of an electromagnetic radiation source. A photovoltaic array support supports a photovoltaic array at the predetermined distance from the reflective surface so that the blurred image of the electromagnetic radiation source covers a substantial portion of a receiving surface of the photovoltaic array. A receiver including an array of photovoltaic devices is coupled to the photovoltaic array support, the receiver converting electromagnetic radiation into electrical energy.

According to yet another aspect, the subject matter disclosed herein includes a method for constructing a concentrating solar energy collecting system. A compressive force is applied to opposing ends of a flexible plate being reflective on one surface. The opposing ends of the flexible plate are secured to a frame at a span less than the distance between the ends when the flexible plate is unflexed to sustain the compressive force. A torque is applied to the ends so that a cross-section of the flexible plate forms a substantially sinusoidal curve for producing a blurred reflection of a radiation source at a predetermined distance from the reflective surface. A photovoltaic collector is secured to the frame at the predetermined distance for receiving the blurred reflection of the radiation source.

BRIEF DESCRIPTION OF THE DRAWINGS

Embodiments of the subject matter described herein will now be explained with reference to the accompanying drawings, of which.

DETAILED DESCRIPTION

Figure 1:
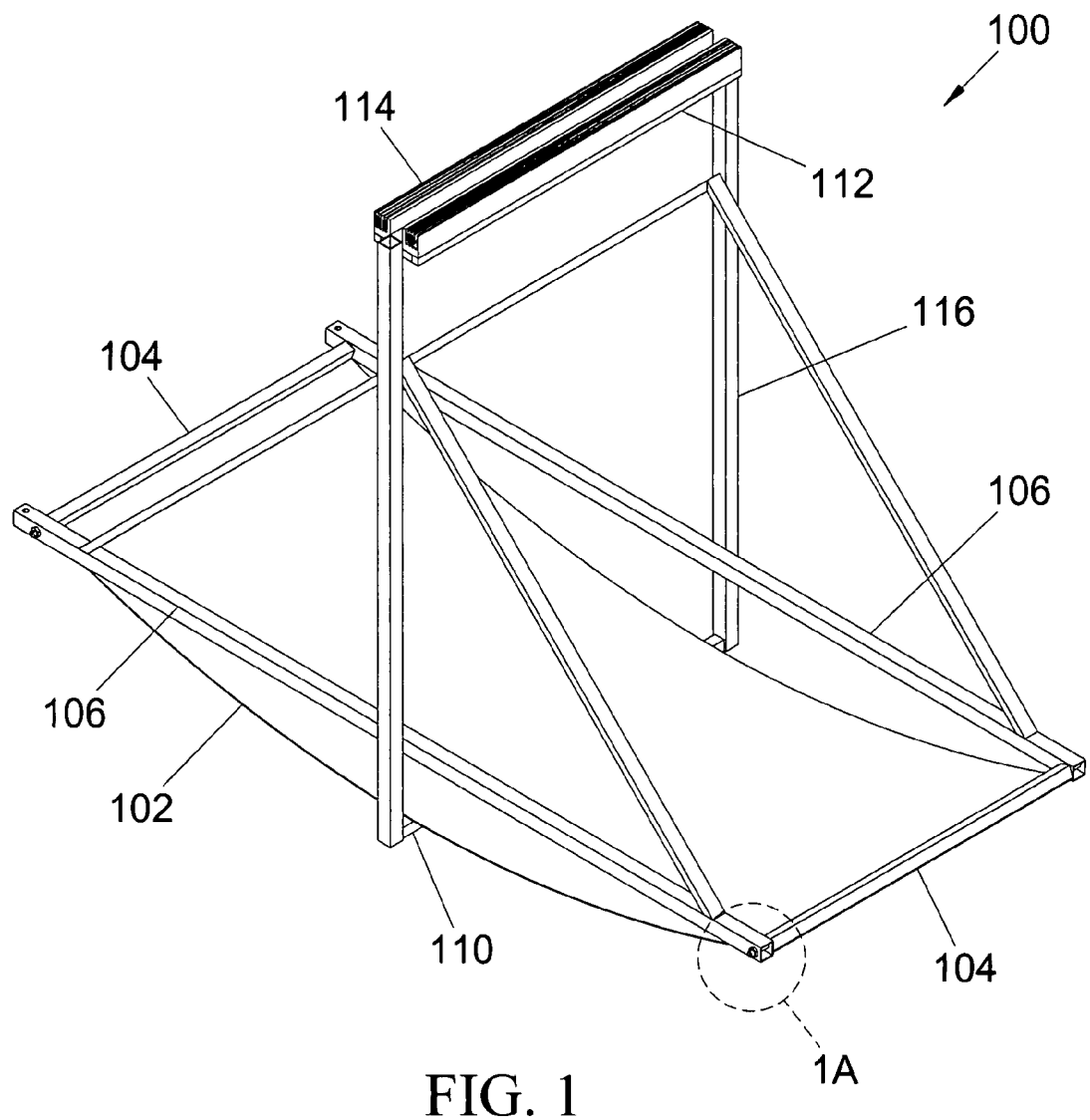
FIG. 1 is a perspective view of an embodiment of the present subject matter.
Figure 1A:
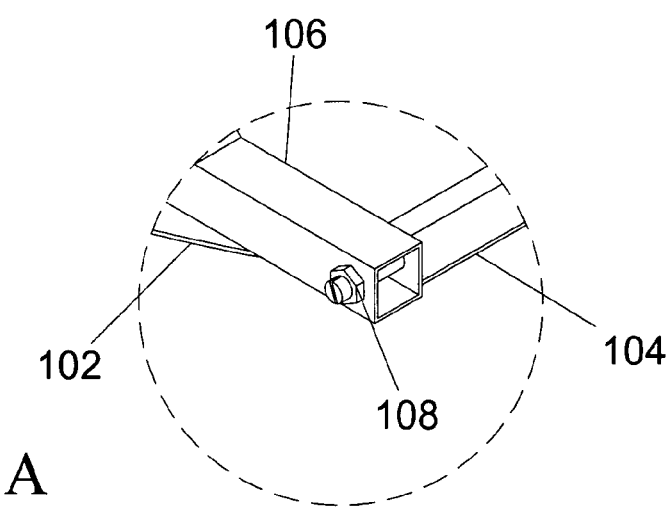
FIG. 1A is a close-up view of a portion of the reflector assembly illustrated in FIG. 1.

Reference will now be made in detail to possible embodiments of the present subject matter, one or more examples of which are shown in the figures. Each example is provided to explain the subject matter and not as a limitation. In fact, features illustrated or described as part of one embodiment can be used in another embodiment to yield still a further embodiment. It is intended that the present subject matter cover such modifications and variations.

According to a well-known empirical rule of thumb (e.g. van Belle, Meinel, & Meinel, proc. *SPIE*, 5489, 563) employed by astronomical telescope designers, the cost of a monolithic telescope scales with diameter as:

$$C=D^{2.5}$$

where C is cost and D is the diameter of the primary optic. The large exponent reflects the difficulty in maintaining optical tolerances as the span of the mirror increases. Based on this law, an array of small light-collecting devices is less expensive than a single large light-collecting device. However, the law breaks down on the small diameter end when the cost of individual parts stops decreasing with size or the labor associated with assembling parts escalates. This breakdown in the relationship between cost and size argues for the production of collecting mirrors with the smallest scale that is commensurate with easy handling during mass production and installation.

Likewise, the scale of photovoltaic cells is set by production concerns. Processing equipment that can handle six-inch semi-conducting wafers is common, as is the stock necessary to produce wafers of this size. Consequently, several manufacturers produce solar cells that are about five inches by five inches when trimmed to their final dimensions. Among these cells are some which are capable of operation when irradiated at 10 to 50 times the normal solar flux. As a result, many trough-shaped collectors that feed a single line of such cells are sized between 50 and 250 inches. The standard dimensions of mass-produced composite sign board fall within this range and suggest a collector design based on this inexpensive technology.

Accordingly, in one aspect, the disclosed subject matter provides a lightweight reflecting optic that is easily handled during mass production and installation and that is well-suited for use with standard sizes of concentrator photovoltaic cells. Specifically, referring to FIG. 1, a solar energy reflector assembly 100 is illustrated as an example of a lightweight solar radiation collecting system for photovoltaic electricity generation. A flexible plate 102 reflective on one surface is coupled at opposing ends to supports 104. A variety of materials can be used for flexible plate 102, including metal, polymer, paper, wood, fiberglass, carbon fiber, and composites or combinations thereof, including corrugated composites or other composites incorporating air spaces.

Supports 104 can be secured to elongate members 106 to form a frame for flexible plate 102 such that the span between supports 104 is smaller than the unflexed length (i.e., the dimension perpendicular to the ends coupled to the supports) of flexible plate 102. The span between supports 104 can be fixed, or it can be adjustable to allow the modification of the amount of compression applied to flexible plate 102, and therefore to modify the amount of flexure of flexible plate 102. The compression of flexible plate 102 along its length required to secure flexible plate 102 within the frame defined by elongate members 106 causes flexible plate 102 to flex (i.e., buckle). This flexure by compression results in flexible plate 102 having a generally sinusoidal shape (i.e., non-parabolic) along a cross section of its length (i.e., in a plane perpendicular to the ends of flexible plate 102 coupled to supports 104).

As a result of this curved profile, solar radiation incident on flexible plate 102 is reflected to a receiving surface of a receiver 112 for converting electromagnetic radiation (e.g., solar energy) into electrical energy. Receiver 112 can be coupled to a photovoltaic array support 116 positioned a predetermined distance from the reflective surface of flexible plate 102 such that the reflection of solar radiation from flexible plate 102 produces a blurred reflection of the electromagnetic radiation source (e.g., the sun) on the receiving surface of receiver 112. This blurred reflection of solar energy is spread across a substantial portion of the receiving surface to optimize the operation of receiver 112 in the conversion of solar energy to electrical energy.

In one implementation, for example, flexible plate 102 can be a flexible sheet that is about four feet wide by eight feet long that is compressed at its ends to fit within a frame that is at least marginally smaller than the eight foot sheet (e.g., about 94 inches wide). In such a configuration, receiver 112 can then be positioned approximately five feet (e.g. about 61 inches) above the reflective surface of flexible plate 102 to collect the reflected solar radiation.

Flexible plate 102 need only be supported at its ends, because the compression by supports 104 is all that is necessary to define the substantially sinusoidal shape. Alternatively, flexible plate 102 can be coupled to support bar 110 so that the sinusoidal shape of flexible plate 102 can be maintained regardless of the orientation of the solar radiation collecting system. This additional support prevents the shape of flexible plate 102 from being deformed by external forces, such as gravity or wind loads. For example, if the solar radiation collecting system is configured to track the sun as it moves across the sky to optimize the effectiveness of receiver 112, gravity could work to skew the curved profile of flexible plate 102 towards one end or the other. To prevent this distortion, support bar 110 can be secured to flexible plate 102 at one or more points to help maintain flexible plate 102 in the shape defined by the compression of mounting flexible plate 102 to the frame defined by elongate members 106.

Figures 2A, 2B:
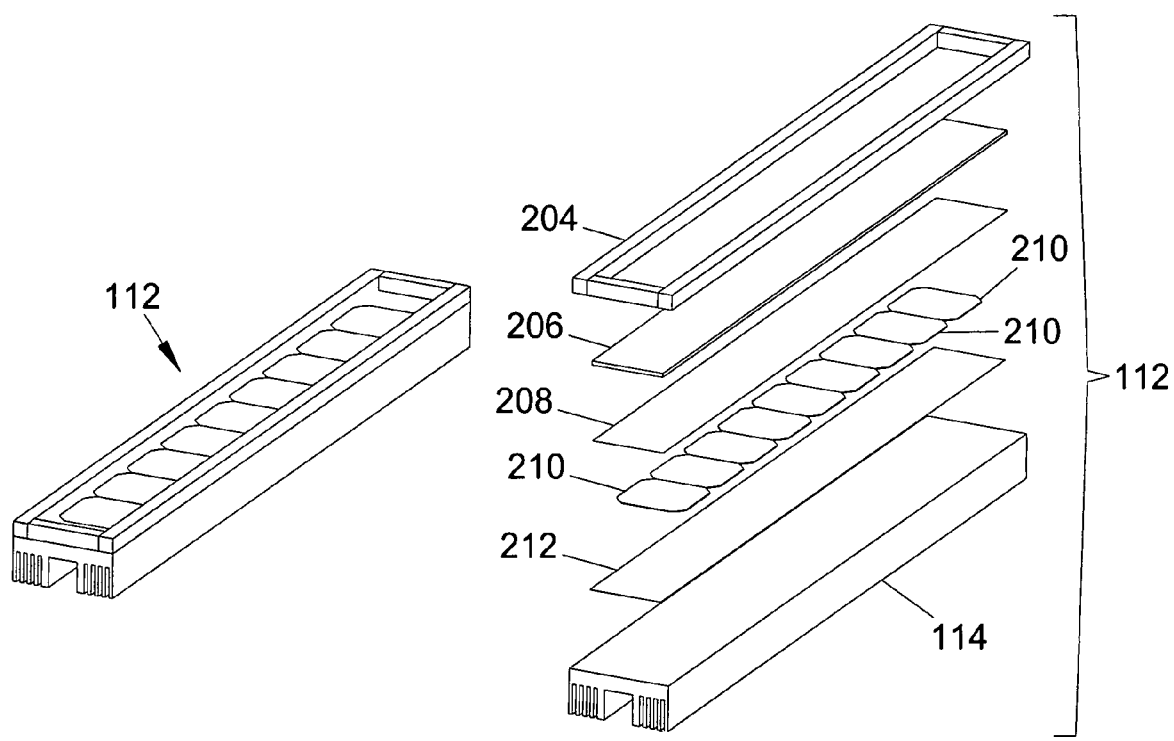
FIGS. 2a and 2b are a perspective view and an exploded view of a photovoltaic receiver according to an embodiment of the present subject matter.

Receiver 112 can be any suitable photovoltaic device for converting solar radiation into electrical energy. FIGS. 2a and 2b illustrate one possible implementation of receiver 112. Referring to FIG. 2a, one possible implementation for receiver 112 is illustrated in an upward facing orientation so that the receiving surface is visible. Receiver 112 can include a laminate design that incorporates various layers to optimize the operation of receiver 112. For instance, as illustrated in FIG. 2b, receiver 112 can be constructed from an aluminum frame 204 that holds a "sandwich" including of a transparent cover plate 206 (e.g., low iron glass), a polymer encapsulant 208 that optically couples cover plate 206 to the solar cells, a linear array 210 consisting of concentrator photovoltaic cells (e.g., nine cells each measuring 125 mm wide, or a multiple of pieces cut from nine cells), a heat conducting but electrically insulating film 212, and a heat sink 114. Cover plate 206 can include an antireflective coating that maximizes power incident on linear array 210 and/or a coating that rejects wavelengths of light that are outside of the sensitivity band of linear array 210. Linear array 210 can be composed of any of a variety of photovoltaic cells such as monocrystalline silicon, polycrystalline silicon, amorphous silicon, laser grooved buried contact, back contact, or multi-junction.

Regarding heat sink 114, according to another rule-of-thumb, the area of heat dissipating surface required for a collecting system to operate efficiently is roughly equal to the collecting area. Thus, an extruded aluminum finned structure or bonded fin device such as is shown in FIGS. 1, 2a and 2b can serve as heat sink 114 to create the surface area necessary to dissipate the heat load effectively while occupying a relatively small space. Alternatively, if the heat load from the solar cells (e.g., linear array 210) is coupled to a surface of flexible plate 102, the cost and weight associated with heat sink 114 can be removed. For instance, receiver 112 can be coupled to the rear surface of flexible plate 102 by a passive heat pipe employing methanol or other working fluid. In still other embodiments, receiver 112 can be mounted to the front surface of flexible plate 102, requiring the use of a secondary optic (e.g., flat or curved mirror) to direct light to the solar cells. Regardless of the specific configuration, a forced flow of air or water over receiver 112 and/or heat sink 114 can be introduced to aid in the dissipation of heat.

The operational shape of flexible plate 102 helps to prevent the development of excessive heat loads by distributing the reflected light over a substantial portion of the surface of receiver 112. A sinusoidal shape, such as is defined by the compression of flexible plate 102 described above, is more advantageous than the usual parabola advocated by many designs for solar concentrators. This advantage is especially apparent in systems that employ reflectors of modest focal length (e.g., less than 2 meters) and solar cells of relatively large size (e.g., greater than 50 mm). Parabolic reflectors are designed to focus a reflected image to a single point (or line for a trough reflector). Because of this design, there is a mismatch between the image size that would be formed by a parabolic reflector and the size of relatively large solar cells.

In contrast, a sinusoidal mirror does not have a single focal point (or focal line). Instead, a sinusoidal mirror produces a blurry image. As a result, a sinusoidal mirror produces a concentration of light more diffuse than the sharp image produced by a parabolic shape. Further, a solar radiation collecting system having such a shape has an advantage over other devices and methods for creating a distributed reflection of solar energy in that it allows adjustment of the concentration factor without the need to change the distance between the reflector and the receiver.

To create a solar radiation collecting system having a generally sinusoidal shape so as to realize the advantages described above, the subject matter described herein relies on the natural bending property of a structural member compressed at its end. A sheet of material with uniform modulus of elasticity and cross section, when compressed from the ends in the absence of other forces, will assume a generally sinusoidal shape according to the well-known Bernoulli-Euler beam loading formula. As long as the ends of the curved reflecting plate are free to rotate, the depth of flexure is small compared to the sheet length, and distortions due to gravitational load are negligible, the theoretical shape of the sheet along its curved dimension is a sine wave.

This shape can be demonstrated by considering the bending moment of a plate compressed at its ends with a force P. The bending moment $M=P\,y$ is related to the radius of curvature $R_c$ as $M=-YI/R_c$, where Y is the Young's modulus of the plate, I is its moment of inertia, and y is the deflection of the plate at a given distance x from the end of the plate. For small deflections, the second derivative of the deflection is the reciprocal of the radius of curvature, yielding the Euler Equation:

$$\frac{d^2y}{dx^2} + \frac{P}{YI}y = 0.$$

The solution to this equation is as follows:

$$y = A\sin\left(\sqrt{\frac{P}{YI}}x\right) + B\cos\left(\sqrt{\frac{P}{YI}}x\right)$$

Applying the boundary condition that the ends (x=0, L) have no deflection (but are free to rotate), eliminates the cosine solution yielding the following relationship:

$$y = A\sin\left(\sqrt{\frac{P}{YI}}x\right), \left(\sqrt{\frac{P}{YI}}L = \pi\right)$$

Figure 3A:
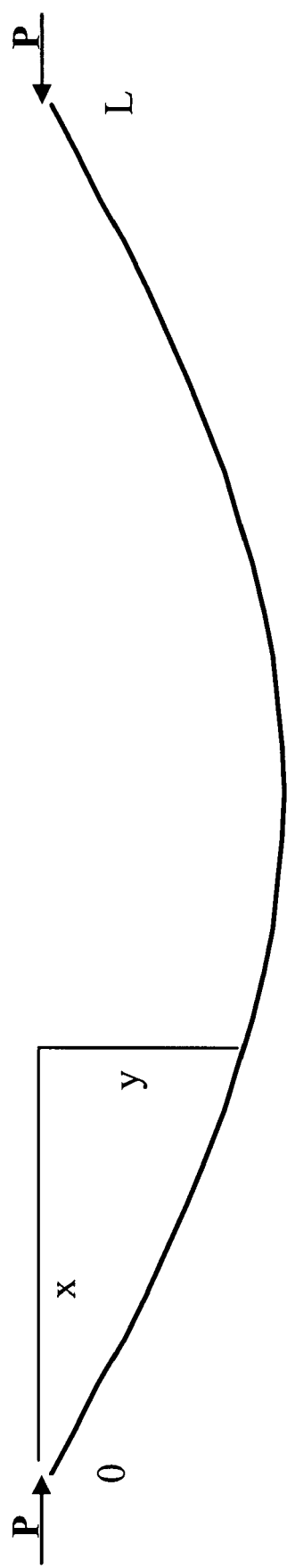
FIG. 3a is a graph of the shape assumed by a slender plate when compressed from its ends.
Figure 3B:
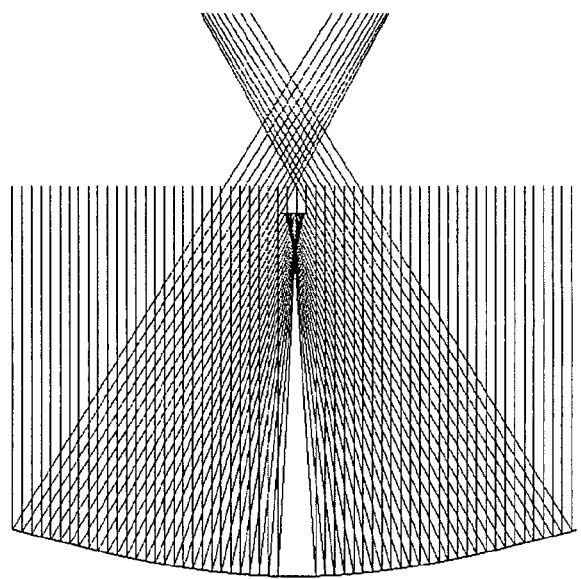
FIG. 3b is a diagram illustrating light rays reflected from a reflector formed from a slender plate when compressed from its ends.
Figure 3C:
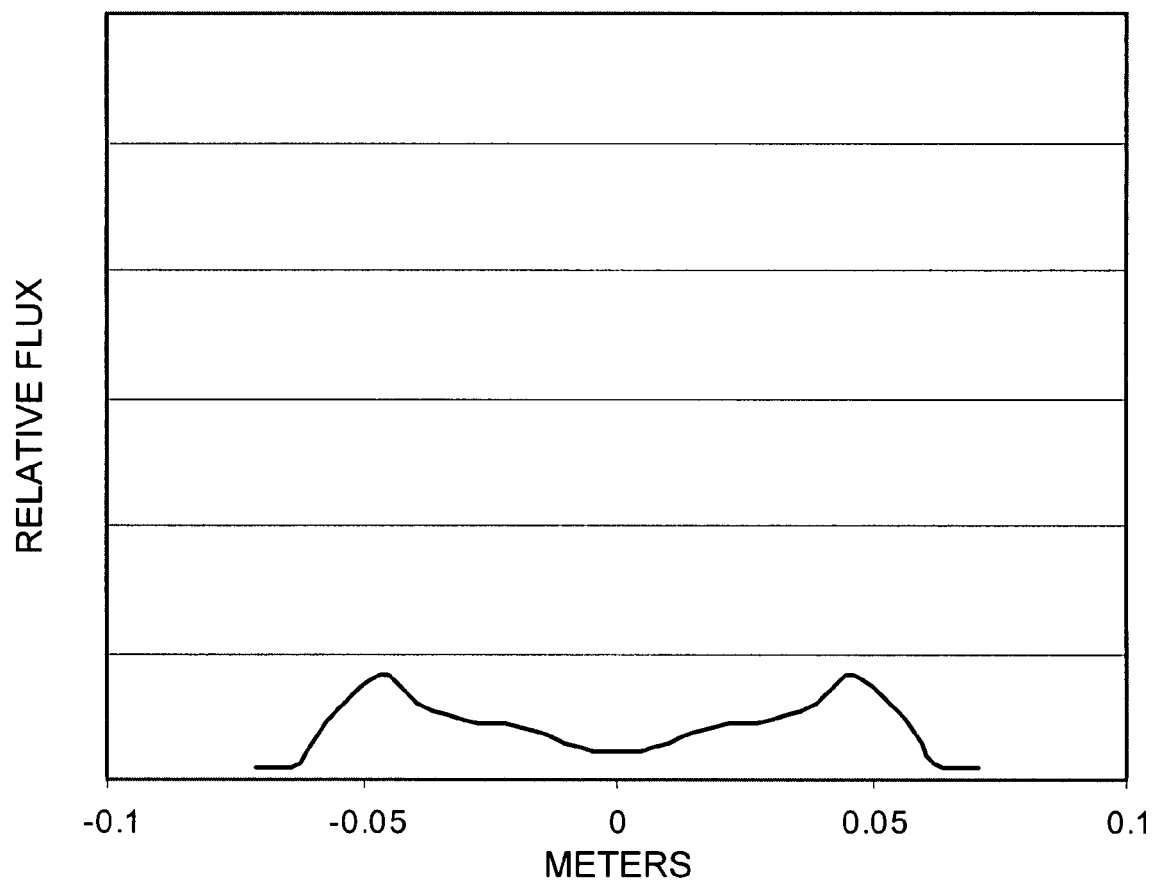
FIG. 3c is a graph of the energy concentration of a mirror formed from a slender plate when compressed from its ends.

As a result, the shape of the curved plate is a half cycle of a sine wave as shown in FIG. 3a. FIG. 3b shows, however, that an optic of this shape can produce an image that is too diffuse for some applications. As can be seen in FIG. 3b, a relatively large receiving surface (i.e., much larger than the receiving surface depicted) would be required to capture all of the energy reflected from the curved plate having this shape. Viewed another way, referring to FIG. 3c, a curved reflector in the shape of a half cycle of a sine wave does not produce a large flux density so as to maximize photovoltaic efficiency.

Figure 4A:
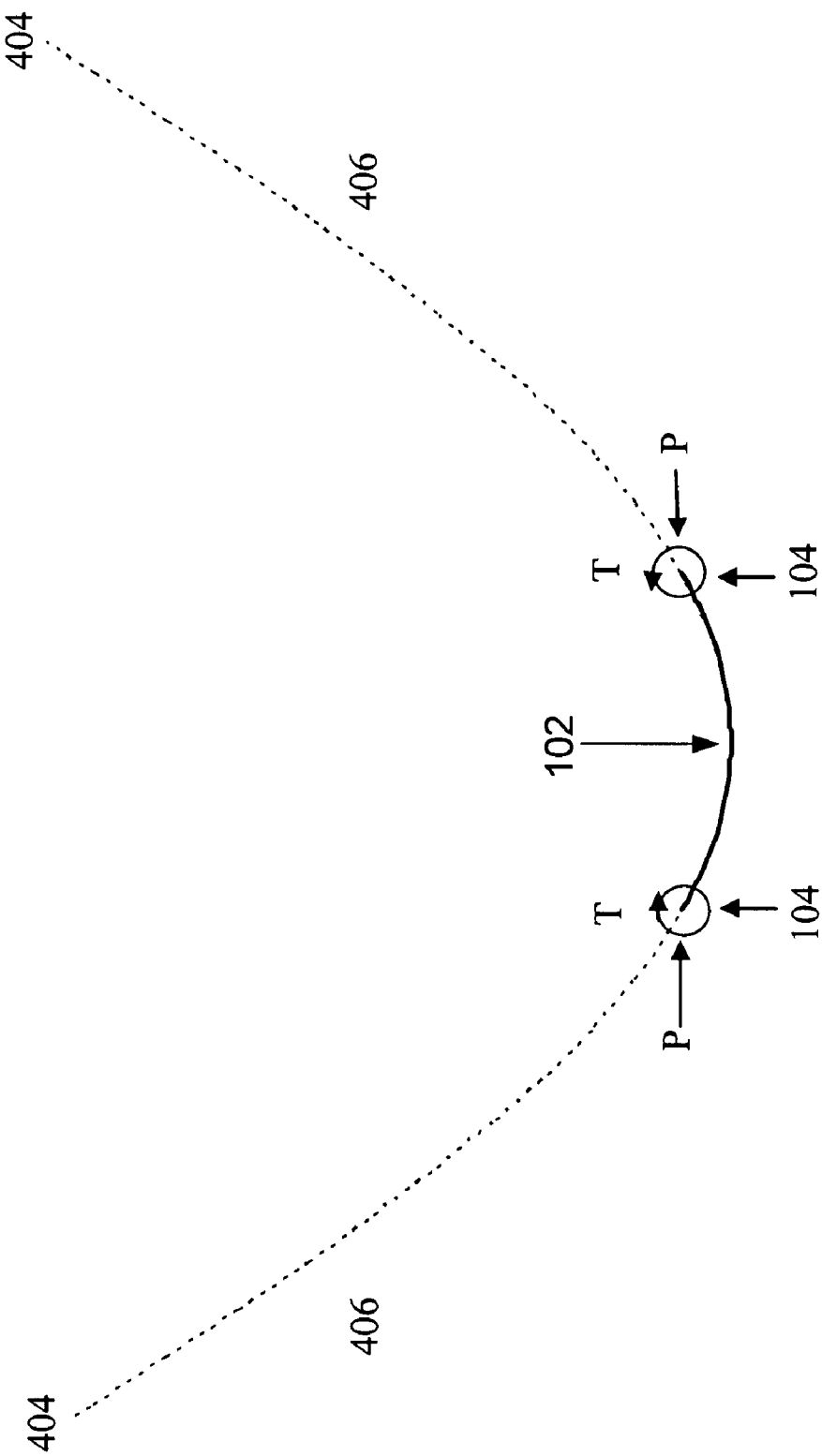
FIG. 4a is a diagram of the shape assumed by a slender plate when the ends of the plate are subjected to both a compressive force and a torque in the direction of curvature according to an embodiment of the present subject matter.
Figure 4B:
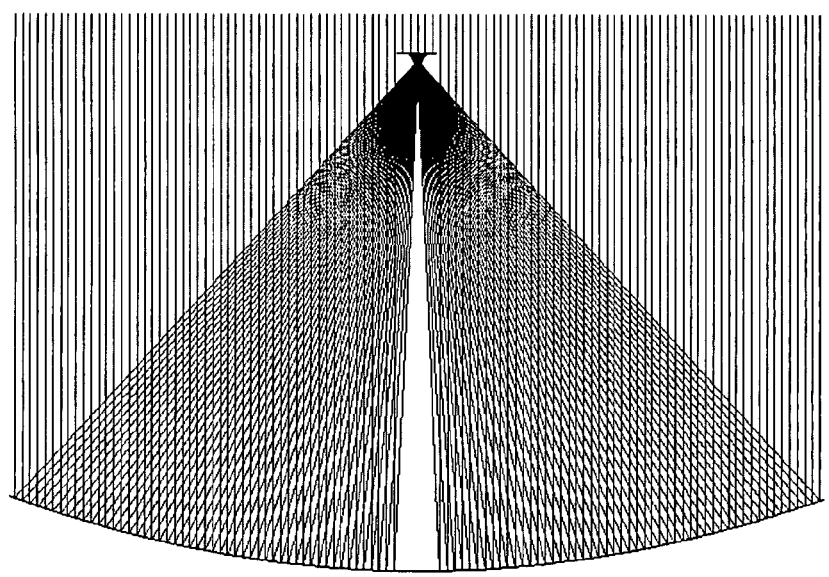
FIG. 4b is a diagram illustrating light rays reflected from a reflector formed from a slender plate when the ends of the plate are subjected to both a compressive force and a torque in the direction of curvature according to an embodiment of the present subject matter.
Figure 4C:
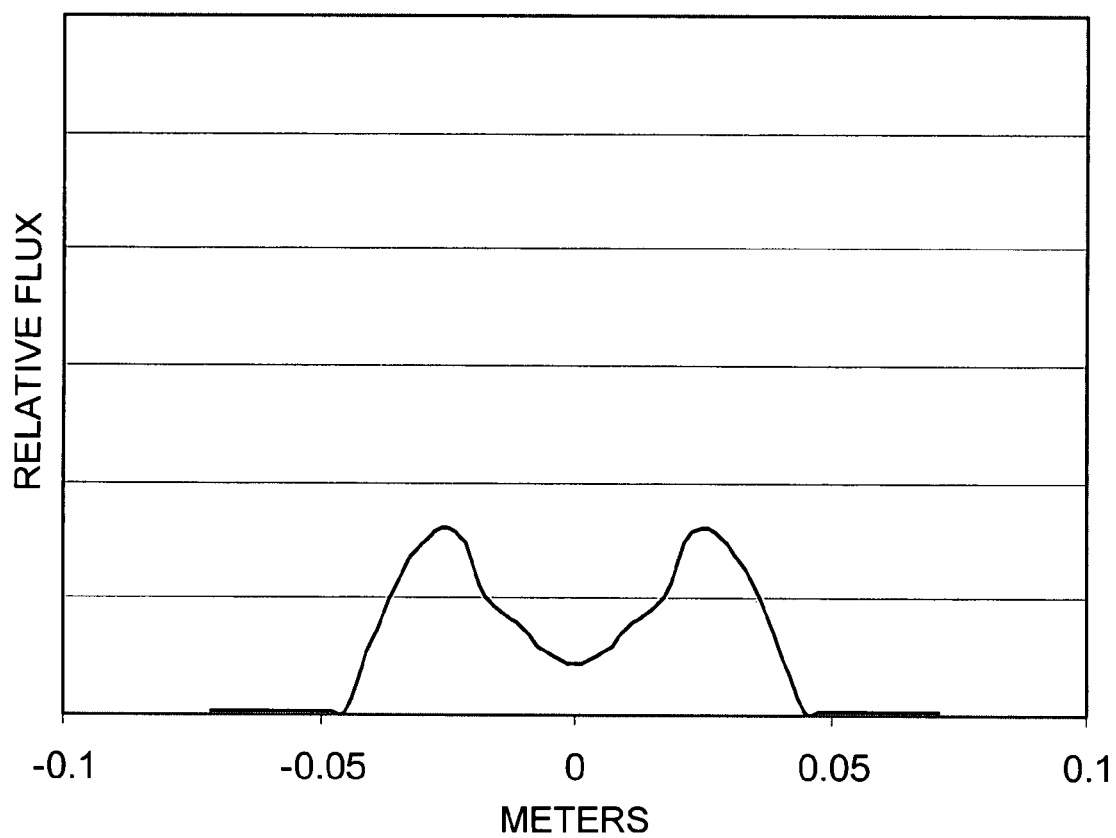
FIG. 4c is a graph of the energy concentration of a mirror formed from a slender plate when the ends of the plate are subjected to both a compressive force and a torque in the direction of curvature.

If, however, the ends of the curved plate are also subjected to equal but opposite torques in the same direction as the induced curvature, then the shape of the curved plate in the small deflection limit becomes a segment less than half a cycle of a sine wave. For instance, FIG. 4a is a representation of a cross-section of flexible plate 102 from FIG. 1. When the ends of flexible plate 102 secured to supports 104 are free to rotate, they are inflection points with zero curvature. Applying a torque to the ends introduces a curvature, and moves the inflection points to virtual ends 404 beyond the end of flexible plate 102. Viewed another way, if a longer plate was mounted with its ends at the locations of virtual ends 404, and then the long plate was grasped at points corresponding to the positions of supports 104 without disturbing the sinusoidal shape of the long plate, cutting away virtual sections 406 of the sheet would produce a segment less than half a cycle of a sine wave. What would remain is a fraction of a sinusoid that requires torque at its ends to maintain its shape. For example, the fraction used in FIGS. 4a through 4c is 0.11857 of a whole period (compare with 0.5 of a whole period for the mirror hinged at its ends without torque). As shown in FIG. 4b, this configuration produces a diffuse image that is smaller than that of a half sine wave configuration but still greater than a parabolic distribution, making it appropriate for common sizes of photovoltaic cells (e.g., 125 mm). As is shown in FIG. 4c, this shape produces a relatively higher energy flux over the receiving surface than a half cycle of a sine wave.

Figure 5:
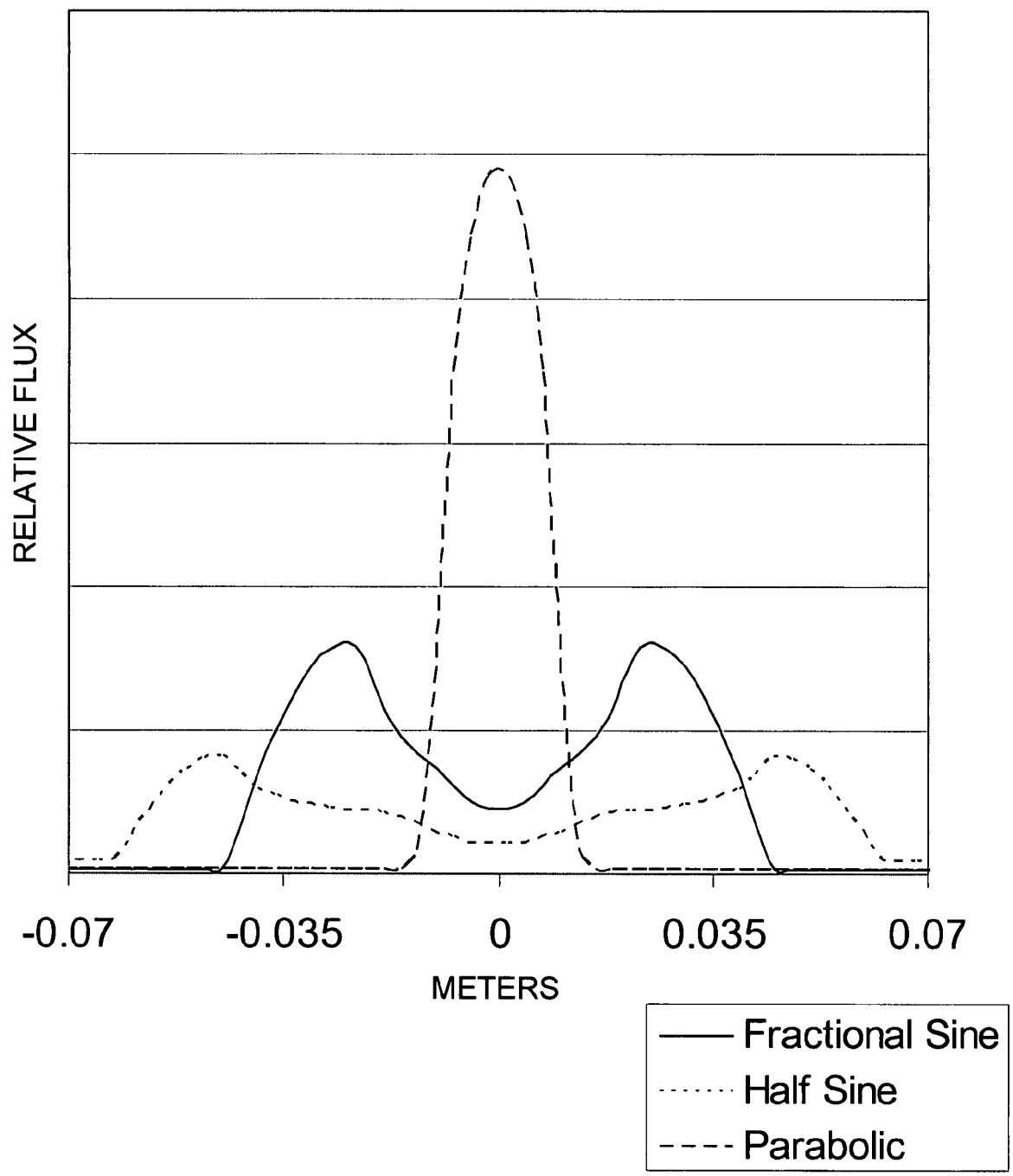
FIG. 5 is a graph comparing the energy concentrations delivered by a sinusoidal mirror, a parabolic mirror, and a fractional sine wave mirror.

Referring to FIG. 5, the illumination provided by the shape of the solar concentrating reflector described by the present subject matter is compared to that of a perfect parabola and a half cycle sine wave. The solar receiving surface (e.g., photovoltaic cells) of the disclosed subject matter intercept light over a 0.125 m linear width, which is narrower than the distribution of light formed by the half cycle sine wave. Conversely, a parabolic shaped reflector would make too narrow a focal line, causing local heating and higher Ohmic dissipation, reducing the efficiency of the photovoltaic devices. As can be seen by this comparison, a solar reflector having a profile generally in the shape of a fractional sine wave can effectively concentrate incident solar radiation over a wider surface than a parabolic reflector, but with a greater relative flux than a half sine wave reflector. In this way, such a shape provides a balance between concentrating the solar energy to maximize the output of the photovoltaic cells and diffusion of light to avoid degrading the efficiency of the photovoltaic cells.

Accordingly, referring again to FIG. 1, torquing members 108 can be provided to modify the shape of flexible plate 102. Torquing members 108 can apply a torque to the ends of flexible plate 102 so that it forms a substantially sinusoidal curve, or, more particularly, a curve that is less than one-half cycle of a sine wave. For example, torquing members 108 can include fasteners for coupling the ends of flexible plate 102 to supports 104 that are rotatable on the frame defined by elongate members 106. In this regard, supports 104 can be rotated to an angle that applies the desired amount of torque to the ends of flexible plate 102. Once the angle is defined, the fasteners can be secured to lock the ends of flexible plate 102 into place. Such a configuration can involve a lever and clamp, ratchet and pawl, lever and manually adjustable screw, or optimally oriented slot and key.

Figure 6A:
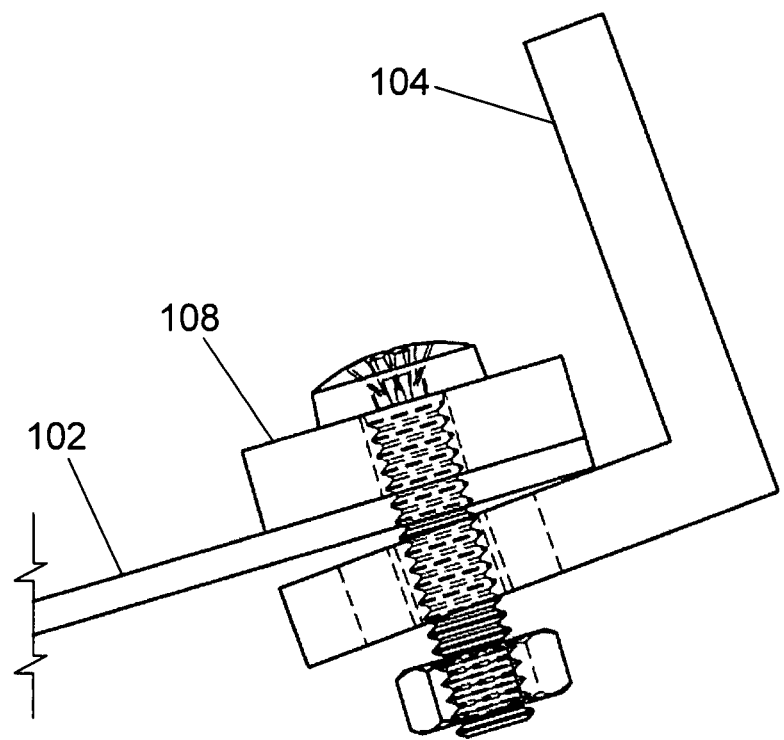
FIGS. 6a and 6b are cross-sectional views of one embodiment of supports for supporting a solar energy reflector in which torquing members are disengaged and engaged, respectively, to apply torque to ends of the solar energy reflector according to an embodiment of the subject matter described herein.
Figure 6B:
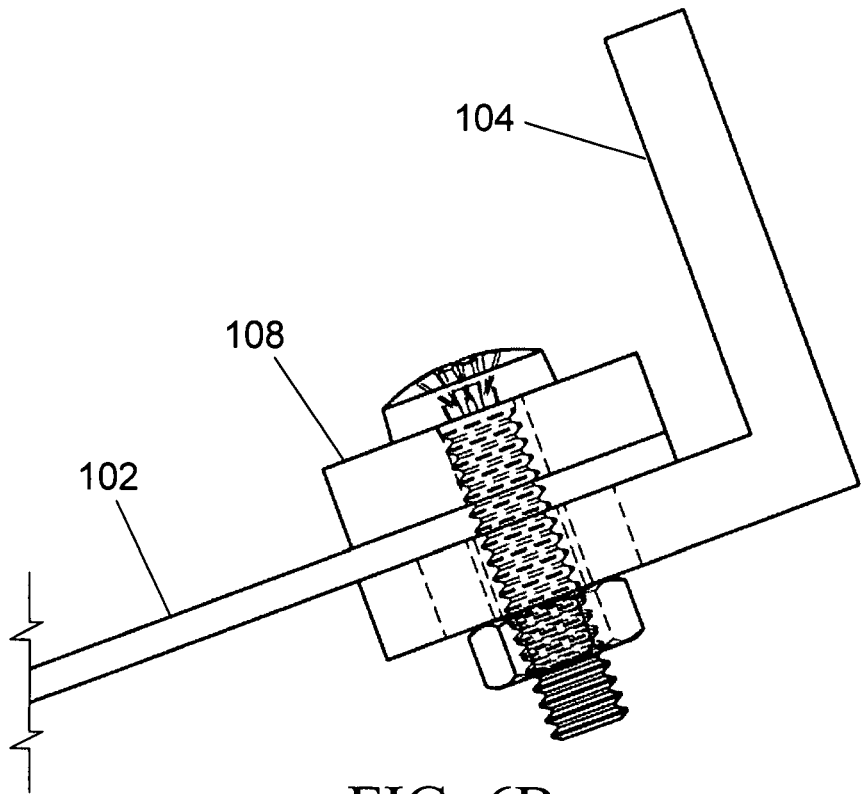

Alternatively, supports 104 can be fixedly secured to the frame at a specific angle. The fixed angle can be designed to impart a torque on flexible plate 102 so as to create a desired shape. In this alternative, torquing members 108 can include an angled member defining the end condition for flexible plate 102 and a locking member for aligning the ends of flexible plate 102 with the angled member and securing the ends in place. As illustrated in FIG. 6a, the ends of flexible plate 102 are positioned between the fixed-angle angled member and the locking member. A fastener (e.g., bolt, clamp) presses the locking member against flexible plate 102, forcing flexible plate 102 to align with the angled member. Further, as illustrated in FIG. 6b, if a bolt is used to press the locking member against flexible plate 102, the opening in the angled member through which the bolt passes can be elongated to account for the rotation of the fastener as it is secured and the lateral movement of the sheet along the angular member.

In either configuration, torquing members 108 can be configured to allow the ends of flexible plate 102 to translate along supports 104 until torquing members 108 are fully engaged and the desired torque is fixed. In other words, as the angle at which the ends of flexible plate 102 are coupled to supports 104 is changed, because of the fixed length of flexible plate 102, each end of flexible plate 102 has a tendency to slip inwardly (e.g., towards the opposite end) to maintain the natural curvature associated with the defined end condition. Otherwise, torquing the ends of flexible plate 102 would effectively apply a tensile force that would prevent flexible plate 102 from achieving a fractional sine wave shape. By allowing this slipping to occur, the shape of flexible plate 102 is defined by the end conditions set by torquing members 108 and not by the stretching of flexible plate 102 between supports 104.

Further, the design of supports 104 and torquing members 108 can be such that flexible plate 102 can be easily removed for cleaning, repair, or replacement, and can be returned to its previous position with the previously applied torsion on its ends. Also, torquing members 108 can be configured such that they do not cast a shadow on flexible plate 102, and thus do not impair the effectiveness of the solar radiation collecting system.

In one particular example of the solar energy reflector assembly described hereinabove, flexible plate 102 can be a composite of polycarbonate with aluminum face sheets measuring 4 mm thick, 96" in the curved dimension, and 48" in the perpendicular dimension. These dimensions are a standard size for mass-produced sign board, and as a result, the materials for this component are widely available. For instance, the product sold in this size under the brand name Dibond has sufficient stiffness to maintain adequate optical figure when mounted as described hereafter to serve as flexible plate 102.

A standard sheet of 4 ft×8 ft, 4 mm Dibond can be polished on one of the aluminum surfaces until it has a specular finish. Alternately, a reflecting film such as the enhanced spectral reflector (ESR) film sold by 3M Corporation of St. Paul, Minn. can be affixed to flexible plate 102, or flexible plate 102 can be provided with some other reflective coating. Further, flexible plate 102 can be overcoated with a clear protective layer (e.g., polyurethane coating) to prevent corrosion and/or oxidation of the underlying reflective surface. Two stiff bars serving as supports 104 can be mounted to each end of flexible plate 102 to compress flexible plate 102 from its ends until it curves to fit into a preconstructed frame. In the embodiment depicted in FIG. 1, supports 104 can be free to rotate about their axes until the locking nuts (i.e., fasteners) serving as torquing members 108 are tightened. Support bar 110 can be attached to flexible plate 102 along a single line across its center such that it does not disturb the natural shape of flexible plate 102 defined by the compression by the frame and torsion by torquing members 108. The use of support bar 110 can serve to counteract the changing effects of gravitational loads as the plate is rotated about one or more axes (e.g., rotation to follow the diurnal motion of the sun). Receiver 112 faces downward in this embodiment, to collect radiation reflected from the curved reflective surface of flexible plate 102.

In this particular example depicted in FIG. 1, a torque can be applied to supports 104 until flexible plate 102 assumes a sinusoidal shape having the desired wave fraction. The supports 104 can then be locked in this orientation by engaging torquing members 108 (e.g., tightening a fastener). Subsequently, support bar 110 can be positioned to just touch the center of flexible plate 102 while the frame is in a horizontal orientation. Support bar 110 can then be attached to flexible plate 102 with fasteners along the line at which the elements contact each other.

In an alternate embodiment, a lightweight foam mirror can serve as flexible plate 102. To mold such a lightweight foam mirror to have the desired sinusoidal profile, a rectangular mold can be provided having a bottom consisting of a sheet of flexible material (e.g., Dibond) flexed into a shape the inverse of the configuration shown in FIG. 1 (i.e., concave sinusoidal curve facing downward). The mold can be filled with expandable foam, such as polyurethane or polystyrene, to produce a lightweight, inexpensive mirror having a generally sinusoidal shape as has been described hereinabove.

Figure 7A:
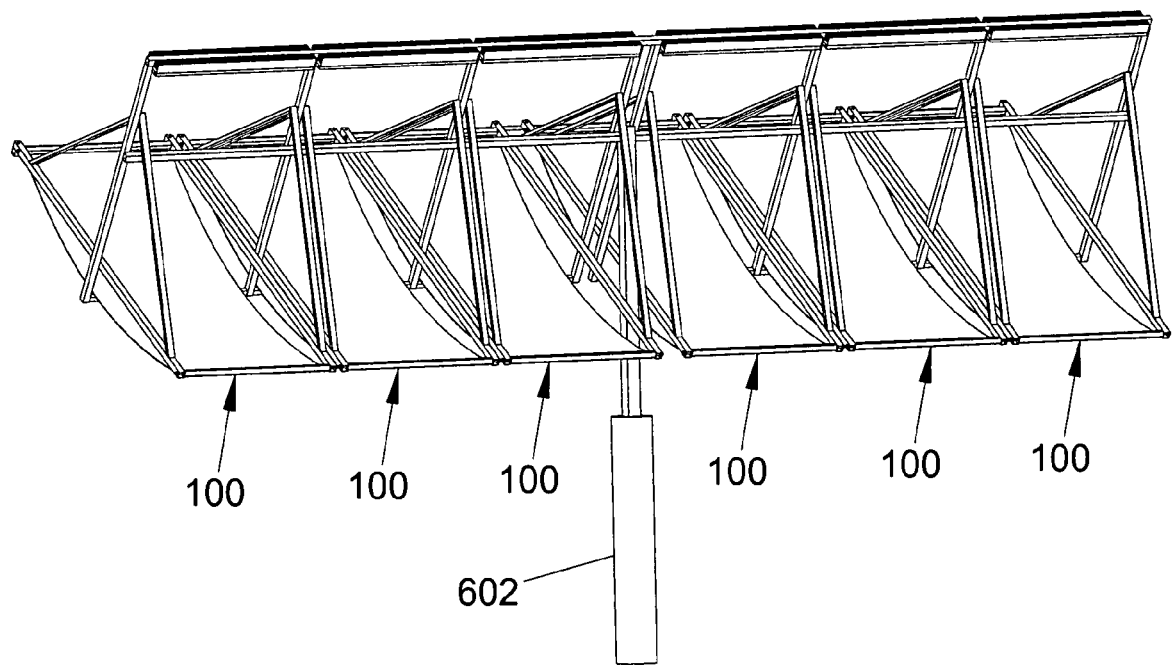
FIG. 7a is a perspective view of a plurality of solar energy collection systems mounted on a firmly mounted pier.
Figure 7B:
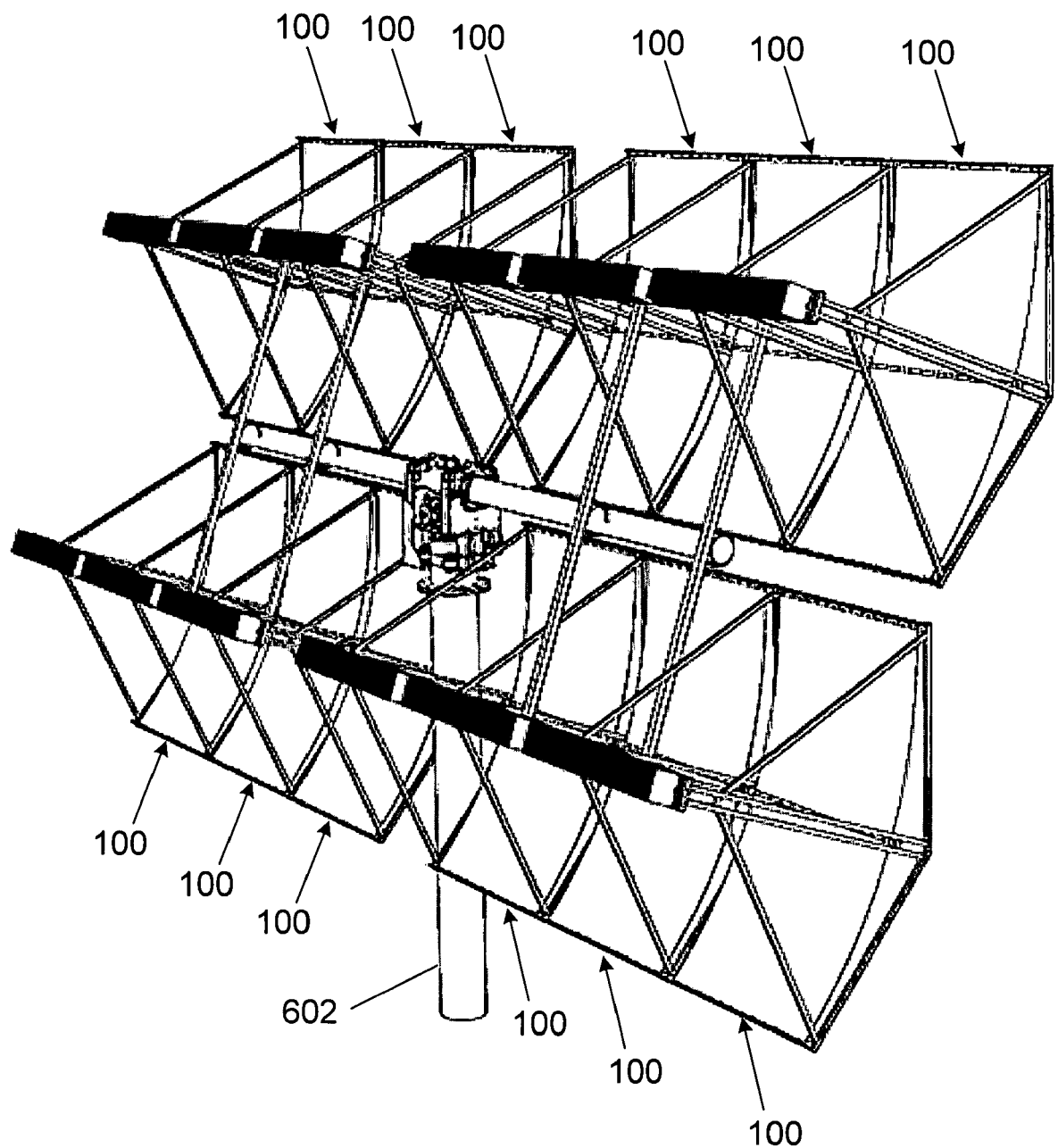
FIG. 7b is a perspective view of a plurality of solar energy collection systems mounted on a tracking system capable of tilting and rotating the solar energy collection systems.

In another aspect, the disclosed subject matter provides an array of lightweight solar radiation collectors for the concentration and conversion of solar radiation to electric energy. Referring to FIGS. 7a and 7b, a plurality of collecting assemblies 100 is mounted on a firmly mounted pier or tracking system 602. The collecting assemblies 100 can be capable of rotating together both azimuthally and in elevation, driven by motors under electronic control. The firmly mounted pier or tracking system 602 can be tall enough (e.g., drive head sitting 10-12 feet above the ground) to allow for a wide range of motion for the plurality of collecting assemblies 100. The computer control system can receive feedback in the form of power generation levels and can, therefore, be able to optimize solar tracking to maximize the instantaneous power production.

In addition, the subject matter described herein can include a control system that alters the fraction of the sinusoid assumed by flexible plate 102 to maintain an optimal distribution of energy across the receiving surface of receiver 112. Alternatively, the position of receiver 112 can be adjusted relative to flexible plate 102 to optimize the output power of the array of photovoltaic devices. In one example, instantaneous power from receiver 112 can be input to an electronic control unit, which drives motors to bend flexible plate 102 into the desired shape to maintain an optimal power distribution. By including a measurement of the instantaneous power from receiver 112 to an electronic control unit, and by driving motors from this same electronic control unit, it is possible to continuously provide nearly optimal torque to the system. This configuration can maintain the optimal fraction of a sine wave at all times.

One way to implement such a configuration can be the use of programmatic computer control. The program can vary the torque up and down at a specified period (e.g., 1 Hz). For example, the maximum value from each sweep can be selected as the new optimal torque. In an alternative approach that would be less sensitive to noise and external events (e.g., cloud cover variation, wind), the component of variation in the signal that corresponds to the drive frequency can be extracted. For instance, the procedure can involve performing a Fourier transform of the signal, zeroing the components far from the drive frequency using an appropriate windowing function, and then performing the inverse Fourier transform on the filtered signal.

In yet another aspect, the disclosed subject matter provides a method for constructing a concentrating solar energy collecting system in which a compressive force is applied to opposing ends of a flexible plate being reflective on one surface. The opposing ends of the flexible plate can be secured to a frame at a span less than a distance between the ends when the flexible plate is unflexed. This securing of the flexible plate to the frame sustains the applied compressive force. A torque can be applied to the ends so that a cross-section of the flexible plate forms a substantially sinusoidal curve for producing a blurred reflection of a radiation source at a predetermined distance from the reflective surface. A photovoltaic collector can then be secured to the frame at the predetermined distance for receiving the blurred reflection of the radiation source. A heat sink can be attached in communication with the photovoltaic collector for dissipating heat from the photovoltaic collector.

The step of securing the flexible plate to the frame can entail coupling supports to the opposing ends of the flexible plate and coupling the supports to the frame. If supports are provided, the step of applying a torque can involve rotating the supports to define an angle at which each end of the flexible plate is secured to the frame and locking the supports at the angle. Alternatively, the step of applying a torque can involve using fasteners to fasten the ends of the flexible plate to the supports at an angle defined by the supports and allowing the flexible plate to translate along the supports as the fasteners are tightened. As a result of either of these alternatives, the cross-section of the flexible plate forms a curve of less than one-half cycle of a sine wave.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A solar energy reflector assembly comprising:
    (a) a flexible plate being reflective on one surface, the flexible plate being flexed to form a segment of a sinusoidal curve spanning less than one half cycle of a sine wave between opposing ends of the flexible plate, wherein the flexible plate produces a blurred reflection of an electromagnetic radiation source across a substantial portion of a light receiving surface of a photovoltaic receiver and greater relative flux than parabolic or half-sine reflectors;
    (b) supports coupled to the opposing ends of the flexible plate;
    (c) a frame securing the supports at a span less than a distance between the opposing ends when the flexible plate is unflexed, whereby the flexible plate is flexed by compression along a dimension perpendicular to the ends coupled to the supports;
    (d) torquing members coupled to the ends of the flexible plate that are coupled to the supports, wherein the torquing members apply a torque to the ends to produce and maintain the curve in the flexible plate; and
    (e) a photovoltaic array support for supporting the photovoltaic receiver so that the light receiving surface of the receiver opposes the reflective surface of the flexible plate and such that the blurred image of the electromagnetic radiation source covers a substantial portion of the receiving surface of the photovoltaic receiver.

2. The assembly of claim 1, wherein the span between the supports is adjustable such that the flexure of the flexible plate can be changed.

3. The assembly of claim 1, wherein the torquing members each comprise an angling member for rotating the support to define an angle at which the end of the flexible plate is coupled within the frame and a locking member for fixing the support at the angle defined by the angling member.

4. The assembly of claim 1, wherein the torquing members each comprise a fastener for coupling the end of, the flexible plate to the support where the flexible plate is free to translate along the support as the fastener is tightened.

5. The assembly of claim 1, wherein the flexible plate is coupled to the frame only at its ends.

6. The assembly of claim 1, wherein the flexible plate is supported on the frame at one or more locations such that the shape of the flexible plate defined by the compression by the frame and the torsion by the torquing members is not altered by forces external from the assembly.

7. The assembly of claim 1, wherein the torquing members are positioned to avoid shadowing of the reflective plate with respect to the electromagnetic radiation source.

8. A concentrating solar energy collecting system for photovoltaic electricity generation comprising:
    (a) a frame;
    (b) supports mounted at opposing ends of the frame;
    (c) a flexible plate being reflective on one surface secured at its ends to the supports, the distance between the ends of the flexible plate when unflexed being longer than the span between the supports such that the flexible plate is flexed by compression along a dimension perpendicular to the ends coupled to the supports, wherein the flexible plate is flexed into a segment of a sinusoidal curve spanning less than one half cycle of a sine wave between opposing ends of the flexible plate, wherein the flexible plate produces a blurred reflection of an electromagnetic radiation source across a substantial portion of a light receiving surface of a photovoltaic receiver and greater relative flux than parabolic or half-sine reflectors;
    (d) torquing members coupled to the ends of the flexible plate that are coupled to the supports for applying a torque to the ends to produce and maintain the curve in the plate;
    (e) a photovoltaic array support for supporting the photovoltaic receiver so that the light receiving surface of the receiver opposes the reflective surface of the flexible plate and such that the blurred image of the electromagnetic radiation source covers a substantial portion of the light receiving surface of the photovoltaic receiver; and
    (f) wherein the receiver includes an array of photovoltaic devices coupled to the photovoltaic array support, the receiver converting electromagnetic radiation into electrical energy.

9. The system of claim 8, wherein the curve is sinusoidal and the torquing members apply such a torque that the curve spans less than one quarter cycle of a sine wave.

10. The system of claim 8, wherein the position of the receiver relative to the flexible plate is adjustable to optimize the output power of the array of photovoltaic devices.

11. The system according to claim 8, further comprising a heat sink for dissipating heat from the receiver.

12. The system of claim 8, wherein the photovoltaic devices comprise solar cells.

13. The system of claim 8, wherein the torquing members are positioned to avoid shadowing of the reflective plate with respect to the electromagnetic radiation source.

* * * * *